(12) United States Patent
Wang et al.

(10) Patent No.: US 11,374,069 B2
(45) Date of Patent: Jun. 28, 2022

(54) DISPLAY PANEL HAVING ELECTROCHROMIC LAYER, DRIVING METHOD THEREOF AND DISPLAY DEVICE

(71) Applicant: WuHan TianMa Micro-Electronics Co., Ltd., Wuhan (CN)

(72) Inventors: Junqiang Wang, Wuhan (CN); Guofeng Zhang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 68 days.

(21) Appl. No.: 16/858,763

(22) Filed: Apr. 27, 2020

(65) Prior Publication Data

US 2020/0258955 A1  Aug. 13, 2020

(30) Foreign Application Priority Data

Oct. 30, 2019 (CN) .......................... 201911047169.1

(51) Int. Cl.
*H01L 27/32* (2006.01)
*H01L 51/52* (2006.01)

(52) U.S. Cl.
CPC ...... *H01L 27/3232* (2013.01); *H01L 27/3246* (2013.01); *H01L 51/5237* (2013.01)

(58) Field of Classification Search
CPC ............. H01L 27/3232; H01L 27/3246; H01L 51/5237
USPC ......................................................... 257/40
See application file for complete search history.

(56) References Cited

U.S. PATENT DOCUMENTS

2015/0077316 A1* 3/2015 Sato .......................... G09G 3/38
345/77
2018/0047790 A1* 2/2018 Chae ................... H01L 27/3248

FOREIGN PATENT DOCUMENTS

CN         107732024 A       2/2018

OTHER PUBLICATIONS

Office Action of CN Patent Application No. 201911047169.1 dated Jul. 7, 2021.

* cited by examiner

*Primary Examiner* — Xia L Cross
(74) *Attorney, Agent, or Firm* — Kilpatrick Townsend & Stockton, LLP (57) ABSTRACT

Provided are a display panel, a driving method thereof and a display device. The display panel includes a substrate, a pixel unit layer and an electrochromic layer. The pixel unit layer includes multiple pixel units arranged in an array and each pixel unit includes a main pixel region and a sub-pixel region. Along a direction facing away from the substrate, the main pixel region includes a first electrode, an organic light-emitting layer and a second electrode, and the sub-pixel region includes a third electrode and a fourth electrode. The first electrode is disposed in the same layer as the third electrode, the second electrode is disposed in the same layer as the fourth electrode, and the main pixel region is insulated from the sub-pixel region. The electrochromic layer is disposed on one side of the pixel unit layer facing away from the substrate.

12 Claims, 6 Drawing Sheets

DISPLAY PANEL HAVING ELECTROCHROMIC LAYER, DRIVING METHOD THEREOF AND DISPLAY DEVICE

CROSS-REFERENCES TO RELATED APPLICATIONS

This application claims the priority to a Chinese patent application No. CN 201911047169.1 filed at the CNIPA on Oct. 30, 2019, disclosure of which is incorporated herein by reference in its entirety.

FIELD

The present disclosure relates to the field of display techniques and, in particular, to a display panel, a driving method thereof and a display device.

BACKGROUND

An organic light-emitting diode (OLED) display panel includes an OLED element, and the OLED element can emit light through carrier injection and recombination under the driving of an electric field. Compared with a liquid crystal display (LCD) panel, the organic light-emitting display panel is lighter and thinner, has a better viewing angle, contrast and the like, and thus attracts much attention.

In the related art, to ensure that the organic light-emitting display panel has a good display effect, that is, to ensure that the color gamut of the organic light-emitting display panel is controlled to meet a standard requirement, the light emitted from the organic light-emitting display panel is filtered through a color filter so that the color coordinates of the emitted light meet the standard requirement.

SUMMARY

Embodiments of the present disclosure provides a display panel, a driving method thereof and a display device to implement an organic light-emitting display panel with a better display color gamut and a smaller thickness.

One embodiment of the present disclosure provides a display panel. The display panel includes a substrate, a pixel unit layer and an electrochromic layer.

The pixel unit layer is disposed on one side of the substrate and includes multiple pixel units arranged in an array, and each of the pixel units includes a main pixel region and a sub-pixel region. Along a direction facing away from the substrate, the main pixel region includes a first electrode, an organic light-emitting layer and a second electrode in turn, and the sub-pixel region includes a third electrode and a fourth electrode in turn. The first electrode is disposed in the same layer as the third electrode, the second electrode is disposed in the same layer as the fourth electrode, and the main pixel region is insulated from the sub-pixel region.

The electrochromic layer is disposed on one side of the pixel unit layer facing away from the substrate and is electrically connected to the second electrode and the fourth electrode separately.

One embodiment of the present disclosure further provides a display device. The display device includes the display panel of any embodiment of the present disclosure.

One embodiment of the present disclosure further provides a driving method of a display panel. The driving method is applicable to the display panel of any embodiment of the present disclosure and includes the steps described below.

In condition that a main pixel region of at least one pixel unit is in a light-emitting state, a first electric field is controlled to be generated between a second electrode and a fourth electrode of the at least one pixel unit so that the electrochromic layer has a first transmittance.

In condition that the main pixel region of the at least one pixel unit is in a non-light-emitting state, a second electric field is controlled to be generated between the second electrode and the fourth electrode of the at least one pixel unit so that the electrochromic layer has a second transmittance, where the first transmittance is greater than the second transmittance.

In the present disclosure, the display panel includes the pixel layer on the substrate, and the pixel unit layer includes the multiple pixel units arranged in an array. Each pixel unit includes the main pixel region and the sub-pixel region. Along the direction facing away from the substrate, the main pixel region includes the first electrode, the organic light-emitting layer and the second electrode, the sub-pixel region includes the third electrode disposed in the same layer as the first electrode and the fourth electrode disposed in the same layer as the second electrode, the main pixel region is insulated from the sub-pixel region in each pixel unit, and thus, the second electrode of the main pixel region is insulated from the fourth electrode of the sub-pixel region. The electrochromic layer is further disposed on the pixel unit layer and is electrically connected to the second electrode and the fourth electrode separately. Therefore, in embodiments of the present disclosure, it is feasible to control the electric field between the second electrode and the fourth electrode to change the transmittance of the electrochromic layer, filtering the outgoing light of the multiple pixel units, and accordingly, the electrochromic layer can replace a color filter to perform the light filtering on the display panel, so that the color coordinates of the outgoing light of the display panel can meet the standard requirements of a user. Moreover, it is not necessary to provide the display panel with the color filter, reducing the overall thickness of the display panel effectively. Additionally, it is feasible to change the transmittance of the electrochromic layer to make the electrochromic layer non-transparent, blocking the reflected light, reducing or eliminating unwanted reflection of external light by the display panel and improving the visibility of the display panel in the strong light.

DETAILED DESCRIPTION

Hereinafter the present disclosure will be further described in detail in conjunction with the drawings and embodiments. It is to be understood that the embodiments set forth below are intended to illustrate and not to limit the present disclosure. Additionally, it is to be noted that, for ease of description, only part, not all, of the structures related to the present disclosure are illustrated in the drawings.

Figure 1:
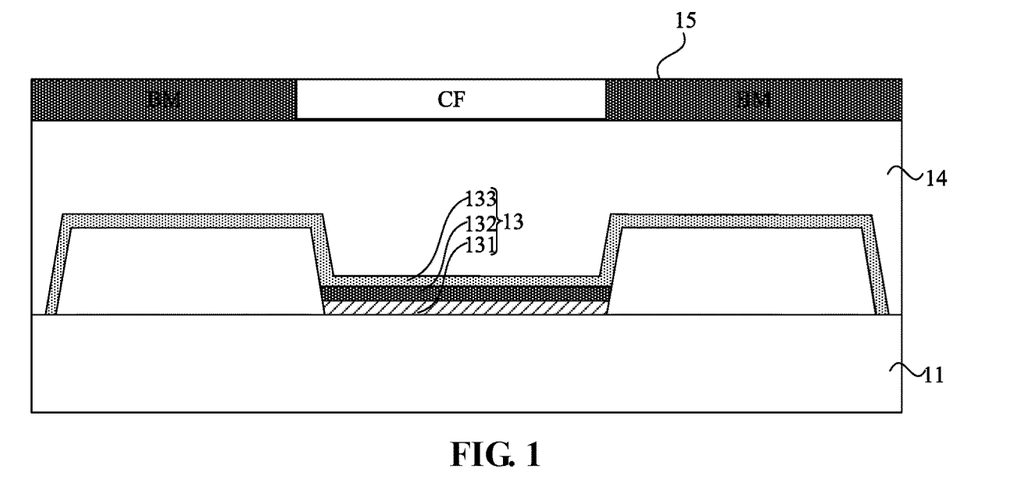
FIG. 1 is a sectional view of a display panel according to the related art.

FIG. 1 is a sectional view of a display panel according to the related art. The organic light-emitting display panel includes a substrate 11 and a pixel unit layer disposed on the substrate 11, where the pixel unit layer includes pixel units 13 arranged in an array, and each of the pixel units 13 is provided with a first electrode 131, an organic light-emitting layer 132 and a second electrode 133 along a direction facing away from the substrate 11 in turn. Different pixel units 13 can emit light having different colors, for example, red light, green light or the like, implementing the image display. An encapsulation layer 14 for protecting the pixel unit layer and a color filter layer 15 are sequentially disposed on the pixel unit layer. The color filter layer 15 includes a color resist block CF and a black color resist block BM disposed between two adjacent color resist blocks CF. Color resist blocks CF are disposed in one-to-one correspondence with the pixel units 13 and includes a red color resist block, a green color resist block, a blue color resist block and the like. Additionally, along a direction vertical to the substrate 11, the vertical projection of each color resist block CF is superposed with the corresponding pixel unit 13, and the light emitted by each pixel unit 13 is filtered by a corresponding color resist block CF and turns into the light with a corresponding color of a fixed waveband required by a user. The black color resist BM does not allow any light to pass through and prevents the stray outgoing light of the pixel units 13 from affecting the display color gamut. It can be known from the above that the color filter layer 15 is configured to filtering the light emitted each pixel unit 13 so that a pixel unit 13 of each color emits the light with a fixed waveband corresponding to a respective color to meet the standard requirements of color coordinates. However, in the implementation of the present disclosure, the inventors find that the color filter layer 15 has a greater thickness, and it is not conducive to the subsequent development and the thin and light setting of the display panel.

To solve the preceding problem, an embodiment of the present disclosure provides a display panel. The display panel includes a substrate, a pixel unit layer and an electrochromic layer.

The pixel unit layer is disposed on one side of the substrate and includes multiple pixel units arranged in an array, and each of the pixel units includes a main pixel region and a sub-pixel region. Along a direction facing away from the substrate, the main pixel region includes a first electrode, an organic light-emitting layer and a second electrode in turn, and the sub-pixel region includes a third electrode and a fourth electrode in turn. The first electrode is disposed in the same layer as the third electrode, the second electrode is disposed in the same layer as the fourth electrode, and the main pixel region is insulated from the sub-pixel region.

The electrochromic layer is disposed on one side of the pixel unit layer facing away from the substrate and is electrically connected to the second electrode and the fourth electrode separately.

In this embodiment of the present disclosure, the display panel includes the pixel layer on the substrate, and the pixel unit layer includes the multiple pixel units arranged in an array. Each pixel unit includes the main pixel region and the sub-pixel region. Along the direction facing away from the substrate, the main pixel region includes the first electrode, the organic light-emitting layer and the second electrode in turn, the sub-pixel region includes the third electrode disposed in the same layer as the first electrode and the fourth electrode disposed in the same layer as the second electrode, the main pixel region is insulated from the sub-pixel region in each pixel unit, and thus, the second electrode of the main pixel region is insulated from the fourth electrode of the sub-pixel region. The electrochromic layer is further disposed on the pixel unit layer and is electrically connected to the second electrode and the fourth electrode separately. Therefore, in this embodiment of the present disclosure, it is feasible to control the electric field between the second electrode and the fourth electrode to change the transmittance of the electrochromic layer, filtering the outgoing light of the multiple pixel units, and accordingly, the electrochromic layer can replace a color filter to perform the light filtering on the display panel, so that the color coordinates of the outgoing light of the display panel can meet the standard requirements of a user. Moreover, it is not necessary to provide the display panel with the color filter, reducing the overall thickness of the display panel effectively. Additionally, it is feasible to change the transmittance of the electrochromic layer to make the electrochromic layer non-transparent, blocking the reflected light, reducing or eliminating unwanted reflection of external light by the display panel and improving the visibility of the display panel in the strong light.

The above is the one embodiment of the present disclosure, and it will be described in conjunction with drawings in the embodiments of the present disclosure.

Figure 2:
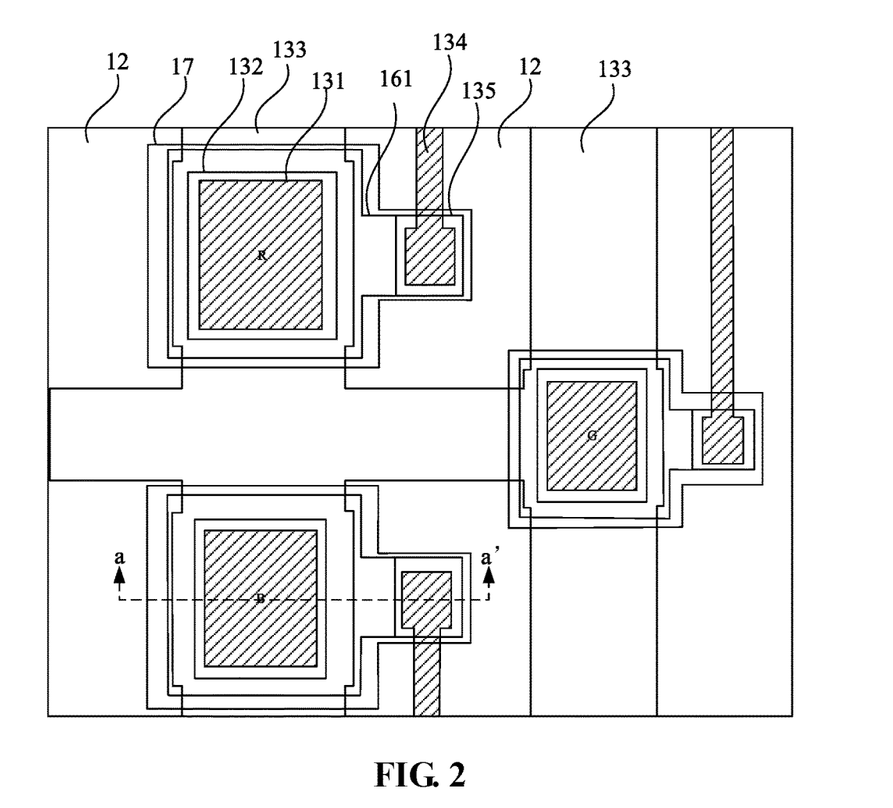
FIG. 2 is a partial plane view of a display panel according to an embodiment of the present disclosure.
Figure 3:
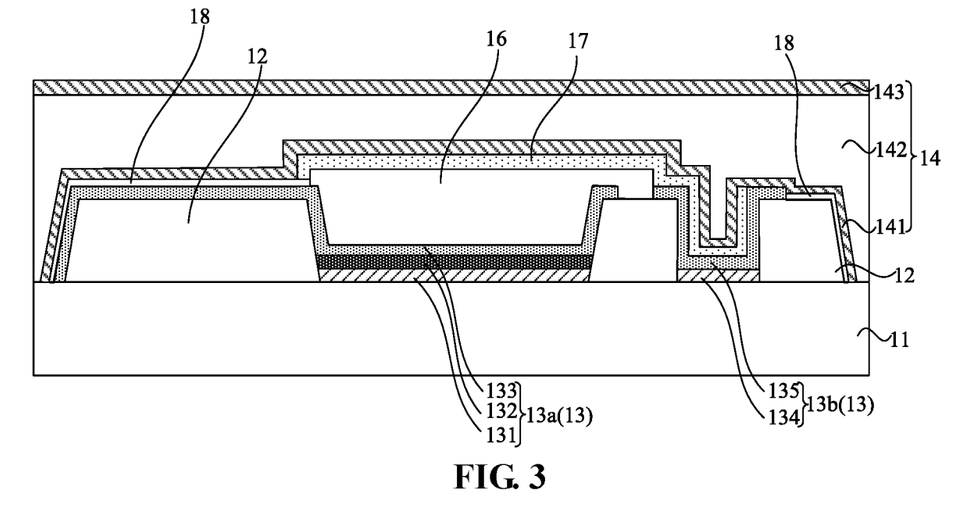
FIG. 3 is a sectional view of the display panel taken along a section line a-a' of FIG. 2.

FIG. 2 is a partial plane view of a display panel according to an embodiment of the present disclosure, and FIG. 3 is a sectional view of the display panel taken along a section line a-a' of FIG. 2. As shown in FIGS. 2 and 3, the display panel includes a substrate 11 and a pixel unit layer that is disposed on one side of the substrate 11 and includes multiple pixel units 13 arranged in an array. The multiple pixel units 13 may include red pixel units R, green pixel units G and blue pixel units B that emit red light, green light and blue light, respectively, implementing the display of the display panel. The red pixel units R, the green pixel units G and the blue pixel units B may be arranged in rows or columns, or may be arranged in delta shapes as shown in FIG. 2. The substrate 11 may be a rigid substrate made of a glass substrate, or may be a flexible substrate made of a polymer material such as polyimide (PI), polycarbonate (PC), polyethersulfone (PES), polyethylene terephthalate (PET), polyethylene naphthalate (PEN), polyarylate (PAR), glass fiber reinforced plastic (FRP) or the like, and the specific material of the substrate 11 is not limited is this embodiment. In one embodiment, a thin film transistor layer (not shown in FIG. 3) is disposed on one side of the substrate 11 facing towards the pixel unit layer. The film transistor layer includes driving circuits in one-to-one correspondence with the multiple pixel units 13 and each driving circuit is configured to control the corresponding pixel unit. Exemplarily, the thin film transistor layer may include a buffer layer on the substrate 11, an active layer on the buffer layer, a gate insulating layer on the active layer, a gate on the gate insulating layer, an interlayer insulating layer on the gate, a source and a drain on the interlayer insulating layer, a passivation layer on the source and drain and so on. In one embodiment, the preceding example only shows the film structure arrangement of one type of thin film transistor layer, that is, the film structure of a top-gate thin film transistor. In this embodiment, the film structure of the thin film transistor layer may have other arrangements, such as the film structure of a bottom-gate thin film transistor layer. The film structure arrangement of the thin film transistor is not limited in this embodiment.

Each pixel unit 13 includes a main pixel region 13a and a sub-pixel region 13b. Along a direction vertical to and away from the substrate 11, the main pixel region 13a includes a first electrode 131, an organic light-emitting layer 132 and a second electrode 133 in turn, and the sub-pixel region 13b includes a third electrode 134 and a fourth electrode 135 in turn. The first electrode 131 may be disposed in the same layer as the third electrode 134, the second electrode 133 may be disposed in the same layer as the fourth electrode 134. Thus, it is feasible to form the first electrode 131 and the third electrode 134 in the same process and form the second electrode 133 and the fourth electrode 135 in the same process, saving the manufacturing process of the display panel and reducing the manufacturing costs of the display panel. In this embodiment, the first electrode 131 and the third electrode 134 may be each an anode and made of indium tin oxide, and the second electrode 133 and the fourth electrode 135 may be each a cathode and made of alloy including silver, for example, magnesium-silver alloy or the like. The organic light-emitting layer 132 includes a light-emitting material stimulated to emit light. Exemplarily, light-emitting materials of the red pixel unit R and the green light-emitting unit G include a phosphorescent material, and the light-emitting material of the blue light-emitting unit B includes a fluorescent material. The organic light-emitting layer 132 in the pixel unit layer of the display panel may be formed through an evaporation method. The first electrode 131, the second electrode 133, the third electrode 134 and the fourth electrode 135 of the display panel may be formed through an evaporation method, a sputtering method, a vapor deposition method, an ion beam deposition method, an electron beam deposition method or a laser ablation method.

Continuing to refer to FIG. 3, the main pixel region 13a is insulated from the sub-pixel region 13b, and thus, the sub-pixel region 13b does not affect the image display of the main pixel region 13a. In this embodiment, the first electrode 131 is insulated from the third electrode 134, and the second electrode 133 and the fourth electrode 135 are disconnected from each other. In one embodiment, the display panel may further include a pixel defining layer 12. The pixel defining layer 12 is disposed on one side of the pixel unit layer facing towards the substrate 11 and is configured to insulate adjacent pixel units 13 from each other and insulate the main pixel region 13a from the sub-pixel region 13b in each pixel unit 13. In one embodiment, the pixel defining layer may be made of an organic layer of acrylic, polyimide (PI), benzocyclobutene (BCB) or the like. An electrochromic layer 16 is disposed on one side of the pixel unit layer facing away from the substrate 11 and is electrically connected to the second electrode 133 and the fourth electrode 135 separately. Thus, in this embodiment, although the second electrode 133 and the fourth electrode 135 are disconnected from each other, the second electrode 133 may be electrically connected to the fourth electrode 135 through the electrochromic layer 16. The electrochromic layer 16 can be reversibly switched between a transparent state and a non-transparent state under the control of an electric field. In this embodiment, the main pixel region 13a is configured to generate outgoing light, and the sub-pixel region 13b is not used for the display but configured to control the electrochromic layer 16 and adjust the state of the electrochromic layer 16 under an electric field between the second electrode 133 and the fourth electrode 135. In this embodiment, it is feasible to control the light-shielding state of the electrochromic layer 16 through the transparency change of the electrochromic layer 16 to implement the shielding function and the filtering function of the display panel, to prevent the light leakage phenomenon of the display panel in a non-display state and prevent the circumstance in which the color gamut of the display panel does not meet the standard requirements and affects the display effect of the display panel. The display panel of this embodiment can adjust the electrochromic layer 16 according to different display requirements, and specifically, by the voltage difference between the second electrode 133 and the fourth electrode 135. Exemplarily, the second electrode 133 is used as a cathode of the main pixel region 13a and may be generally configure with a fixed voltage, but the fourth electrode 135 may obtain a different voltage than the second electrode 133 through a corresponding thin film transistor. Moreover, different voltages can be input through the thin film transistor so that the second electrode 133 and the fourth electrode 135 obtain different voltage differences, and thereby, the electrochromic layer 16 has different light-transmitting states. In this way, the electrochromic layer 16 can quickly and reversibly switch between a transparent state and a non-transparent state with a better flexibility, and thus can play a good role of the color gamut adjustment and achieve better display effects. Additionally, the electrochromic layer 16 has a much smaller film thickness than the color filter layer 15 shown in FIG. 15 and helps further reduce the thickness of the display panel, enhancing the aesthetics of the formed display device. Furthermore, a thinner display panel helps the subsequent integration and development of display panel functions. For example, a fingerprint recognition function, an infrared measurement function or the like can be integrated into the display panel. Moreover, the reduction in the thickness of the display panel increases the light emission rate of each pixel unit and prevents the loss of the outgoing light between films, reducing the display power consumption of the display panel to a certain extent.

In one embodiment, the electrochromic layer 16 is made of at least one of tungsten trioxide, polythiophene and a derivative of the polythiophene, viologen, tetrathiafulvalene or a metal phthalocyanine compound. In one embodiment, the electrochromic layer 16 is formed through at least one of an electroplating process, a chemical vapor deposition process, a physical vapor deposition process or an evaporation process. During the operating process, the electrochromic layer 16 undergoes redox reaction due to an electric field voltage and gains and loses electrons so that the color of the electrochromic material and the transmittance of the electrochromic layer 16 is changed. Exemplarily, if the electrochromic layer 16 is made of the tungsten trioxide, then when the electric field between the second electrode 133 and the fourth electrode is adjusted, the electrochromic layer 16 can switch between colorless and blue. When colorless, the electrochromic layer 16 can control the outgoing light to be directly emitted; and when blue, the electrochromic layer 16 blocks the outgoing light to prevent the light leakage and reduce the reflection effect of strong external light, preventing the display panel from displaying poorly in the strong external light. In one embodiment, in addition to the preceding examples, the electrochromic layer 16 may be made of molybdenum trioxide, nickel oxide and any electrochromic material reversibly switching between a higher transmittance and a lower transmittance. It is worth noting that, generally, the electrochromic material is colorless or shows a light color when having a higher transmittance and shows a deep color when having a lower transmittance, but different electrochromic materials show different deep colors. For example, the molybdenum trioxide switches between colorless and dark blue, or between colorless and black, so the deep color of the molybdenum trioxide is dark blue or black; and the nickel oxide switches between colorless and dark brown, so the deep color of the nickel oxide is black brown.

In one embodiment, the electrochromic layer 16 has a first transmittance in condition that the second electrode 133 and the fourth electrode 135 generate a first electric field and has a second transmittance in condition that the second electrode 133 and the fourth electrode 135 generate a second electric field, where the first transmittance is greater than the second transmittance. The first transmittance is greater than or equal to 80%, and the second transmittance is less than or equal to 10%. In this embodiment, the maximum change range of the transmittance of the electrochromic layer 16 can be configured to be between the first transmittance and the second transmittance, and the transmittance of the electrochromic layer 16 can be changed between the first transmittance and the second transmittance through the control of the electric field between the second electrode 133 and the fourth electrode 135. Then, in condition that the second electrode 133 and the fourth electrode 135 generate a first electric field, the electrochromic layer 16 may be configured to reach the first transmittance, that is, the maximum transmittance; and in condition that the second electrode 133 and the fourth electrode 135 generate a second electric field, the electrochromic layer 16 may be configured to reach the second transmittance, that is, the minimum transmittance. In order to helps the strong transmission of the outgoing light, the first transmittance may be configured to be greater than or equal to 80% and to block the outgoing light, and the second transmittance may be configured to be less than or equal to 10%. In one embodiment, the first transmittance is 90% and the second transmittance is 10%. In one embodiment, the first transmittance may be configured to a value less than 80%, and the second transmittance may be configured to a value greater than 10%, so that different electrochromic materials can be configured according to different transmittance requirements. Additionally, it is also feasible to change only the electric field range between the second electrode 133 and the fourth electrode 135 without changing the electrochromic material, to obtain different first transmittances and second transmittances.

Exemplarily, for the tungsten trioxide, if the first electric field is generated between the second electrode 133 and the fourth electrode 135, then in an example, the second electrode 133 is often used as a cathode and is generally at a zero potential or a negative potential, so when a low level is input to the fourth electrode 135, no electric field is generated between the second electrode 133 and the fourth electrode 135, the tungsten trioxide loses electrons and is in an oxidation state, and the electrochromic layer 16 is in a transparent state, to improve the display effect. In this example, the second electric field is a zero field. In condition that a high level is input to the fourth electrode 135, the second electrode 133 and the fourth electrode 135 generate the second electric field, the tungsten trioxide has electrons and is in a reduced state, and the electrochromic layer 16 is in a light-shielding state, so that the display panel has different transmittances when different voltages are applied to the fourth electrode 135. In this example, the electrochromic layer 16 tends to have a deepened color and a decreased transmittance when the first electric field is higher, but there are other electrochromic materials that enable the electrochromic layer 16 to tend to have a deepened color and a decreased transmittance when the first electric field is lower or even no electric field exists, so the magnitude relationship between the first electric field and the second electric field is not limited in this embodiment.

In one embodiment, continuing to refer to FIGS. 2 and 3, the electrochromic layer 16 may include multiple electrochromic units 161 in one-to-one correspondence with the multiple pixel units 13, the vertical projection of each electrochromic unit 161 onto the substrate 11 covers the main pixel region 13a of the corresponding pixel unit 13 and is electrically connected to the second electrode 133 and the fourth electrode 135 of the corresponding pixel unit 13. The display panel further includes multiple fifth electrodes 17, where the multiple fifth electrodes 17 are disposed on one side of the electrochromic layer 16 facing away from the substrate 11 and are electrically connected to the multiple electrochromic units 161 in an one-to-one correspondence manner; and in a plane parallel to the substrate 11, each fifth electrode 17 covers the corresponding electrochromic unit 161, extends to the sub-pixel region 13b and is electrically connected to the fourth electrode 135. Referring to FIG. 3, it is to be noted that before the fifth electrode 17 is formed on the electrochromic layer 16, an insulating film 18 is formed. The insulating film 18 can insulate the second electrode 133 from the fifth electrode 17 to prevent a short circuit between the second electrode 133 and the fourth electrode 135.

The electrochromic layer 16 may include the multiple electrochromic units 161 in one-to-one correspondence with the multiple pixel units 13, the vertical projection of each electrochromic unit 161 onto the substrate 11 covers the main pixel region 13a of the corresponding pixel unit 13, and thus, each electrochromic unit 161 may be directly in contact with the second electrode 133. In order that the fourth electrode 135 can be electrically connected to the corresponding electrochromic unit 161, the multiple fifth electrodes 17 in one-to-one correspondence with the multiple electrochromic units 161 may be disposed on one side of the electrochromic layer 16 facing away from the substrate 11, and each fifth electrode 17 extends to the sub-pixel region 13b and is electrically connected to the fourth electrode 135, so that each electrochromic unit 161 can be controlled through the electric field between the second electrode 133 and the fourth electrode 135. Then in this example, each electrochromic unit does not extend to the sub-pixel region 13b, reducing the coating area of the electrochromic material and saving the costs of the electrochromic material. In one embodiment, the vertical projection of each fifth electrode 17 onto the substrate 11 covers the corresponding electrochromic unit 161 so that the fifth electrode 17 and the fourth electrode 135 form a uniform electric field with a larger area, and the uniform electric field helps control the electrochromic unit 161 accurately.

Figure 4:
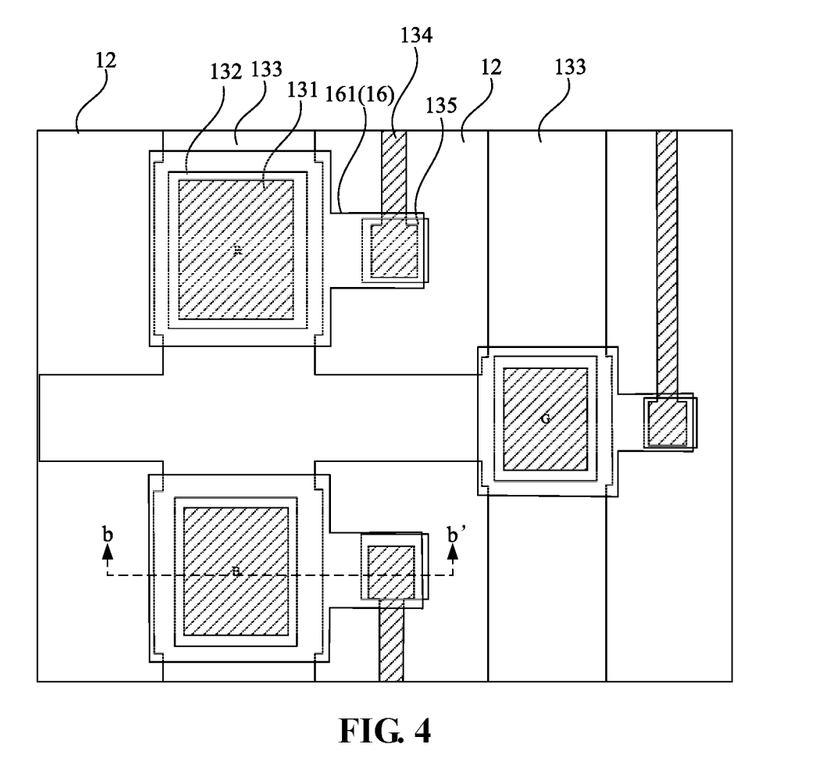
FIG. 4 is a partial plane view of another display panel according to an embodiment of the present disclosure.
Figure 5:
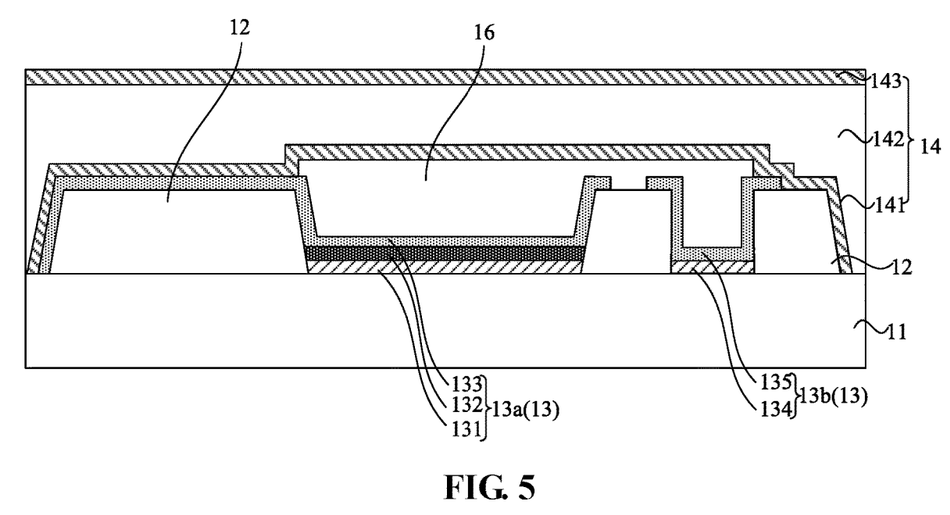
FIG. 5 is a sectional view of the display panel along taken a section line b-b' of FIG. 4.

In one embodiment, referring to FIGS. 4 and 5, FIG. 4 is a partial plane view of another display panel according to an embodiment of the present disclosure, and FIG. 5 is a sectional view of the display panel along a section line b-b' of FIG. 4. The electrochromic layer 16 may include multiple electrochromic units 161 in one-to-one correspondence with the multiple pixel units 13, the vertical projection of each electrochromic unit 161 onto the substrate 11 covers the main pixel region 13a and the sub-pixel region 13b of the corresponding pixel unit 13, and each electrochromic unit 161 is electrically connected to the second electrode 133 and the fourth electrode 135 of the corresponding pixel unit 13. In this embodiment, as shown in FIG. 4, the vertical projection of each electrochromic unit 161 onto the substrate 11 covers the main pixel region 13a and the sub-pixel region 13b of the corresponding pixel unit 13, and thus, each electrochromic unit 161 can be directly in contact with the corresponding second electrode 133 and the corresponding fourth electrode 135, so that the second electrode 133 and the fourth electrode 135 can be electrically connected to the corresponding electrochromic unit 161. Then in this embodiment, it is not necessary to provide the display panel with a fifth electrode 17, effectively reducing the thickness of the display panel, saving the manufacturing process and reducing the production costs.

Figure 6:
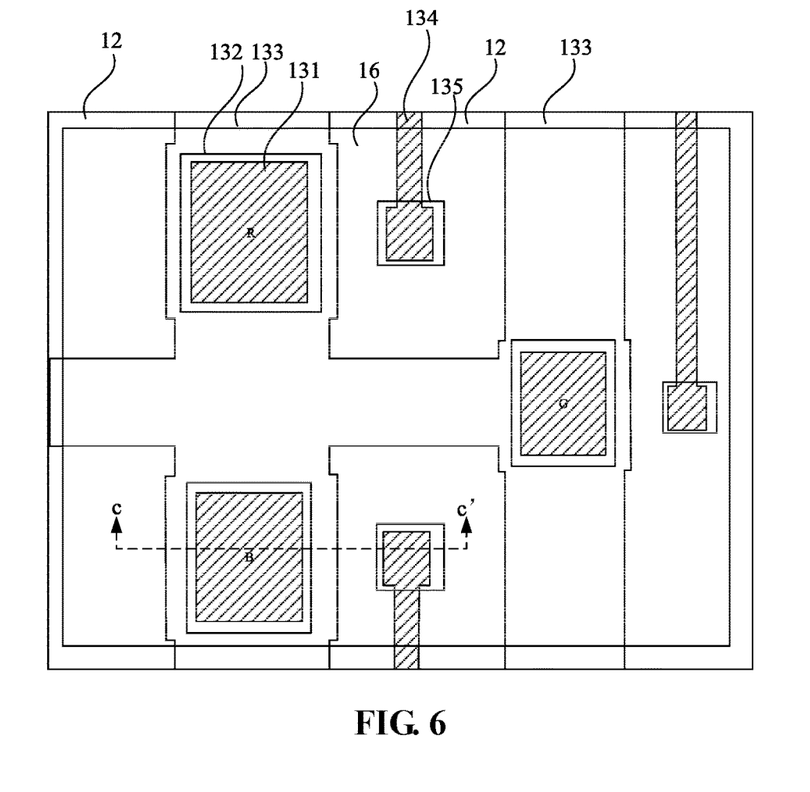
FIG. 6 is a partial plane view of another display panel according to an embodiment of the present disclosure.
Figure 7:
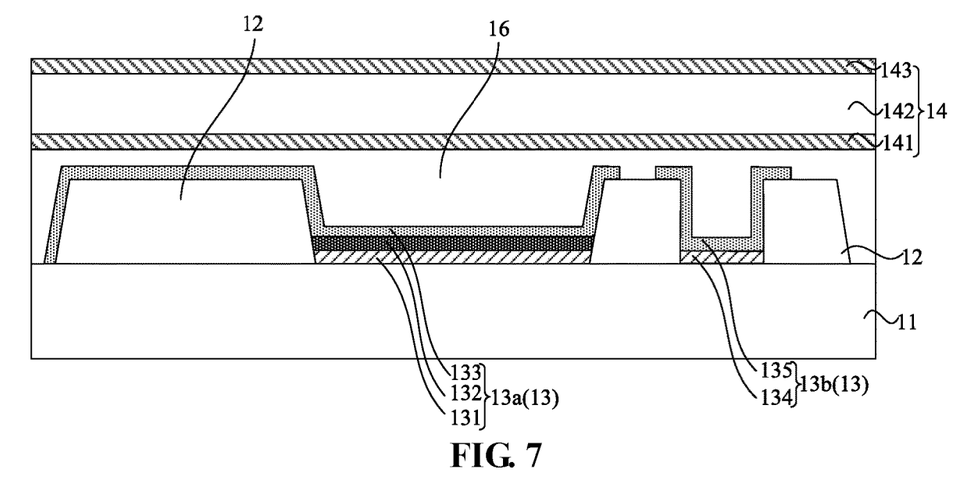
FIG. 7 is a sectional view of the display panel along taken a section line c-c' of FIG. 6.

In one embodiment, referring to FIGS. 6 and 7, FIG. 6 is a partial plane view of another display panel according to an embodiment of the present disclosure, and FIG. 7 is a sectional view of the display panel along a section line c-c' of FIG. 6. The electrochromic layer 16 may be a monolithic structure, the vertical projection of the electrochromic layer 16 onto the substrate 11 covers each pixel unit 13, and the electrochromic layer 16 is electrically connected to the second electrode 133 and the fourth electrode 135 of each pixel units 13. In this embodiment, the vertical projection of the electrochromic layer 16 onto the substrate 11 covers the main pixel region 13a and the sub-pixel region 13b of each pixel unit 13, and thus, the electrochromic unit 161 is directly electrically connected to the second electrode 133 and the fourth electrode 135 of each pixel unit 13, so that it is feasible to control second electrodes 133 and fourth electrodes 135 of only parts of the multiple pixel units 13 to generate the electric field to configure the entire electrochromic layer 16 with different colors. This embodiment may be applied to a display environment having different levels of brightness. Exemplarily, in outdoor light with a stronger brightness, the second electric field may be generated for the entire electrochromic layer 16 through the second electrodes 133 and the fourth electrodes 135 of parts of the multiple pixel units and the electrochromic layer 16 is controlled to have a deeper color that reduces the reflectivity to external light, so that the display panel is prevented from having a poor image display effect in strong light. In indoor light with an extremely low brightness, the first electric field may be generated for the entire electrochromic layer 16 through the second electrodes 133 and the fourth electrodes 135 of parts of the multiple pixel units and the electrochromic layer 16 is controlled to have a lighter color and a greater transmittance, so that a great amount of outgoing light of the multiple pixel units 13 is emitted, the brightness of displayed images of the display panel is enhanced and the viewing of a user is easier.

In one embodiment, continuing to refer to FIGS. 2 to 7, the display panel may further include an encapsulation layer 14. The encapsulation layer is disposed on one side of the electrochromic layer 16 facing away from the substrate 11, and the vertical projection of the encapsulation layer 14 onto the substrate 11 covers the substrate 11.

The encapsulation layer 14 includes at least one inorganic layer and at least one organic layer, and each inorganic layer and each organic layer are sequentially stacked. Referring to FIG. 2, exemplarily, the encapsulation layer 14 includes a first inorganic layer 141, a first organic layer 142 and a second inorganic layer 143, and in one embodiment, the encapsulation layer 14 may further include an inorganic layer, an organic layer, an inorganic layer and an organic layer along the direction facing away from the substrate 11. The specific film structure of the encapsulation layer 14 is not limited in this embodiment. The encapsulation layer 14 is configured to protect the pixel unit layer and the electrochromic layer 16 to prevent water, oxygen or other impurities from invading the pixel unit layer, improving the lifetime of the display panel.

Figure 8:
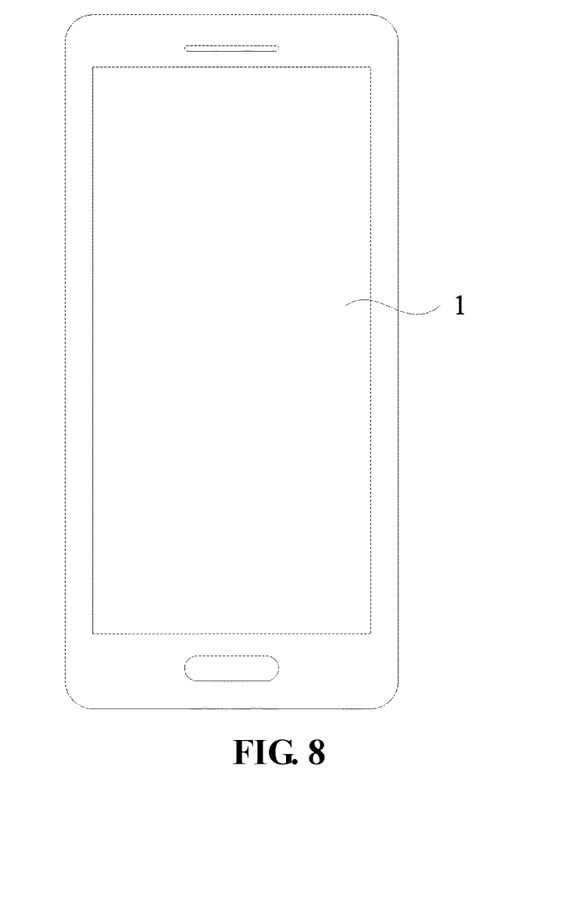
FIG. 8 is a structural diagram of a display device according to an embodiment of the present disclosure.

An embodiment of the present disclosure further provides a display device. FIG. 8 is a structural diagram of a display device according to an embodiment of the present disclosure. As shown in FIG. 8, the display device of the embodiment of the present disclosure includes the display panel 1 of any embodiment of the present disclosure. The display device may be a mobile phone 200 as shown in FIG. 8, or may be a computer, a television, a smart wearable device or the like, which is not limited in the embodiment.

Figure 9:
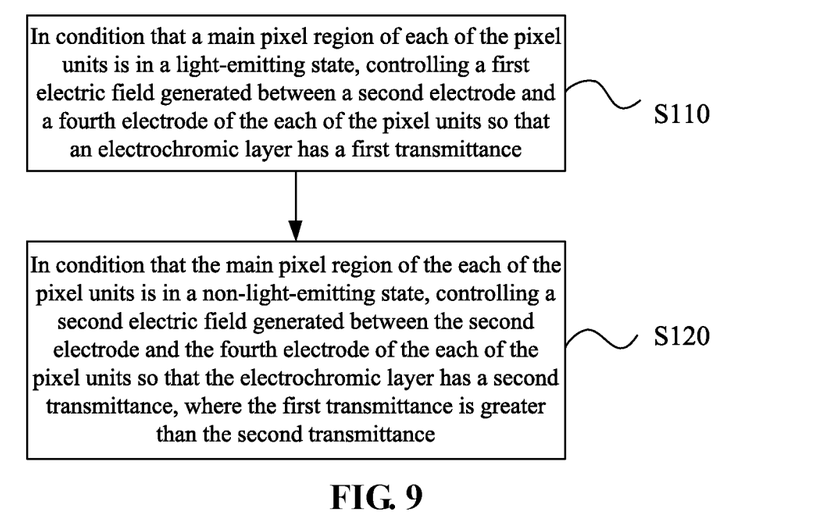
FIG. 9 is a flowchart of a driving method of a display panel according to an embodiment of the present disclosure.

Based on the same concept, an embodiment of the present disclosure further provides a driving method of a display panel. The driving method is applicable to the display panel of any embodiment of the present disclosure. FIG. 9 is a flowchart of a driving method of a display panel according to an embodiment of the present disclosure. As shown in FIG. 9, the method of this embodiment includes the steps described below.

In step S110, in condition that a main pixel region of each of the pixel units is in a light-emitting state, a first electric field is controlled to be generated between a second electrode and a fourth electrode of the each of the pixel units so that the electrochromic layer has a first transmittance.

In step S120, in condition that the main pixel region of the each of the pixel units is in a non-light-emitting state, a second electric field is controlled to be generated between the second electrode and the fourth electrode of the each of the pixel units so that the electrochromic layer has a second transmittance, where the first transmittance is greater than the second transmittance.

The first transmittance is greater than the second transmittance. In this embodiment, the transmittance or display color of the electrochromic layer of the display panel may be controlled entirely or locally. Exemplarily, as shown in FIG. 2, when the electrochromic layer includes multiple electrochromic units in one-to-one correspondence with the multiple pixel units, it is feasible to control the transmittance of each pixel separately to further enhance the displayed image contrast of the display panel and enhance the color gamut fullness. In this embodiment of the present disclosure, a pixel unit layer includes the multiple pixel units arranged in an array, and each pixel unit includes a main pixel region and a sub-pixel region. Along a direction facing away from the substrate, the main pixel region includes a first electrode, an organic light-emitting layer and a second electrode, the sub-pixel region includes a third electrode disposed in the same layer as the first electrode and a fourth electrode disposed in the same layer as the second electrode, the main pixel region is insulated from the sub-pixel region in each pixel unit, and thus, the second electrode of the main pixel region is insulated from the fourth electrode of the sub-pixel region. The electrochromic layer is further disposed on the pixel unit layer and is electrically connected to the second electrode and the fourth electrode separately. Therefore, in this embodiment of the present disclosure, it is feasible to control the electric field between the second electrode and the fourth electrode to change the transmittance of the electrochromic layer, filtering the outgoing light of the each of the pixel units and accordingly, the electrochromic layer can replace a color filter to perform the light filtering on the display panel, so that the color coordinates of the outgoing light of the display panel can meet the standard requirements of a user. Moreover, it is not necessary to provide the display panel with the color filter, reducing the overall thickness of the display panel effectively. Additionally, it is feasible to change the transmittance of the electrochromic layer to make the electrochromic layer non-transparent, blocking the reflected light, reducing or eliminating unwanted reflection of external light by the display panel and improving the visibility of the display panel in the strong light.

Figure 10:
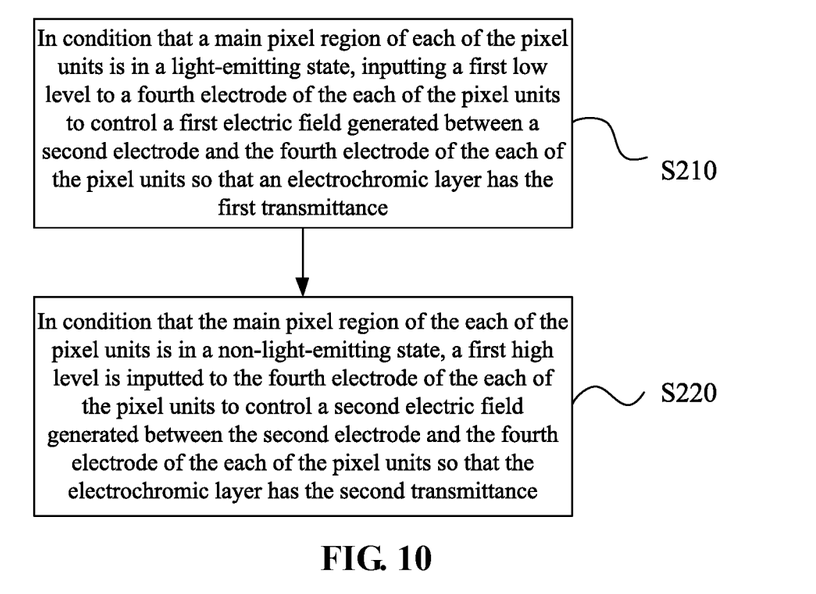
FIG. 10 is a flowchart of another driving method of a display panel according to an embodiment of the present disclosure.

In one embodiment, the electrochromic layer may include the multiple electrochromic units in one-to-one correspondence with the multiple pixel units, the vertical projection of each electrochromic unit onto the substrate covers the main pixel region of the corresponding pixel unit or covers the main pixel region and a sub-main pixel region of the corresponding pixel unit, and each electrochromic unit is electrically connected to the second electrode and the fourth electrode of the corresponding pixel unit. Referring to FIG. 10, FIG. 10 is a flowchart of another driving method of a display panel according to an embodiment of the present disclosure, and the driving method of a display panel may include the steps described below.

In step S210, in condition that the main pixel region of the each of the pixel units is in the light-emitting state, a first low level is input to the fourth electrode of the each of the pixel units to control the first electric field generated between the second electrode and the fourth electrode of the each of the pixel units so that the electrochromic layer has the first transmittance.

In step S220, in condition that the main pixel region of the each of the pixel units is in the non-light-emitting state, a first high level is input to the fourth electrode of the each of the pixel units to control the second electric field generated between the second electrode and the fourth electrode of the each of the pixel units so that the electrochromic layer has the second transmittance.

Continuing to refer to FIG. 2, in condition that the electrochromic layer includes the multiple electrochromic units disposed in one-to-one correspondence with the multiple pixel units, the electrochromic layer may be configured with different transmittances in different regions, and the transmittance of each electrochromic unit may be configured separately. In this embodiment, the second electrode is a cathode disposed in an entire layer and has a potential fixed at a low level. During the progressive scanning of the multiple pixel units arranged in an array, a low level is input to a fourth electrode of each of the pixel units in the light-emitting state, that is, the each of the pixel units emitting the outgoing light, and thus, the first electric field is extremely less and the corresponding electrochromic unit has a higher transmittance, that is, the first transmittance. However, a high level is input to a fourth electrode of each of the pixel units in the non-light-emitting state, that is, the each of the pixel units emitting no outgoing light, and thus, the first electric field is greater and the corresponding electrochromic unit has a lower transmittance.

In one embodiment, a driving method of a display panel. In one embodiment, the driving method of a display panel may include: in condition that the main pixel region of the each of the pixel units is in the light-emitting state, a first high level is input to the fourth electrode of the each of the pixel units the first electric field is controlled to be generated between the second electrode and the fourth electrode of the each of the pixel units so that the electrochromic layer has the first transmittance; and in condition that the main pixel region of the each of the pixel units is in the non-light-emitting state, a first low level is input to the fourth electrode of the each of the pixel units the second electric field is controlled to be generated between the second electrode and the fourth electrode of the each of the pixel units so that the electrochromic layer has the second transmittance.

Figure 11:
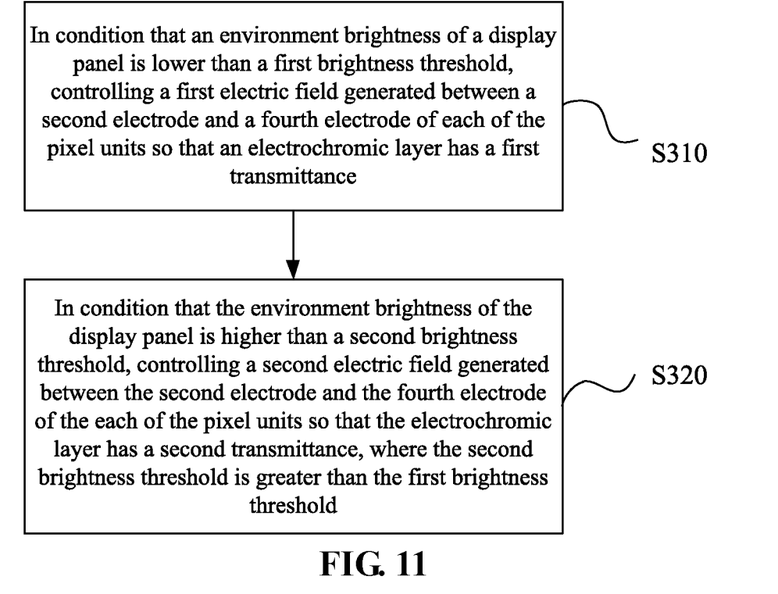
FIG. 11 is a flowchart of another driving method of a display panel according to an embodiment of the present disclosure.

Referring to FIG. 11, FIG. 11 is a flowchart of another driving method of a display panel according to an embodiment of the present disclosure. In one embodiment, the electrochromic layer may be a monolithic structure, the vertical projection of the electrochromic layer onto the substrate covers each pixel unit, and the electrochromic layer is electrically connected to the second electrode and the fourth electrode of each pixel unit. The driving method of a display panel may include the steps described below.

In step S310, in condition that an environment brightness of the display panel is lower than a first brightness threshold, the first electric field is controlled to be generated between the second electrode and the fourth electrode of the each of the pixel units so that the electrochromic layer has the first transmittance.

In step S310, in condition that the environment brightness of the display panel is higher than a second brightness threshold, the second electric field is controlled to be generated between the second electrode and the fourth electrode of the each of the pixel units so that the electrochromic layer has the second transmittance, where the second brightness threshold is greater than the first brightness threshold.

The vertical projection of the electrochromic layer onto the substrate covers each pixel unit, and thus, an electrochromic unit is directly electrically connected to the second electrode and the fourth electrode of each pixel unit, so that it is feasible to control second electrodes 133 and fourth electrodes 135 of only parts of the multiple pixel units 13 to generate the electric field to configure the entire electrochromic layer 16 with different colors, saving the power consumption during the driving process of the display panel. This embodiment can be applied to a display environment having different levels of brightness. In condition that the environment brightness of the display panel is lower than the first brightness threshold, the second electric field may be generated for the entire electrochromic layer through the second electrodes and the fourth electrodes of parts of the multiple pixel units and the electrochromic layer 16 is controlled to have a deeper color that reduces the reflectivity to external light, so that the display panel is prevented from having a poor image display effect in strong light. In condition that the environment brightness of the display panel is higher than the second brightness threshold, the first electric field may be generated for the entire electrochromic layer through the second electrodes and the fourth electrodes of part of the multiple pixel units and the electrochromic layer is controlled to have a lighter color and a greater transmittance, so that a great amount of outgoing light of the multiple pixel units 13 is emitted, the brightness of displayed images of the display panel is enhanced and the viewing of the user is easier. For example, the first brightness threshold may be an outdoor brightness, and the second brightness threshold may be an indoor brightness.

In one embodiment, regardless of whether the electrochromic layer is controlled entirely or divided into electrochromic units that is controlled separately, the driving method of a display panel may further include: in condition that the environment brightness of the display panel is lower than the first brightness threshold, the first electric field is controlled to be generated between the second electrode and the fourth electrode of each pixel unit so that the electrochromic layer has the first transmittance; and in condition that the environment brightness of the display panel is higher than the second brightness threshold, the second electric field is controlled to be generated between the second electrode and the fourth electrode of each pixel unit so that the electrochromic layer has the second transmittance. The solution of this embodiment can solve the problem in which the external light of the display panel affects the user viewing of displayed images of the display panel, reduce reflection of external light, and filter the outgoing light of the display panel, so that the color gamut of the display panel can meet the standard requirements of the user.

What is claimed is:

1. A display panel, comprising:
   a substrate, a pixel unit layer disposed on one surface of the substrate, and an electrochromic layer disposed on one surface of the pixel unit layer facing away from the substrate;
   wherein the pixel unit layer comprises a plurality of pixel units arranged in an array, wherein each of the plurality of pixel units comprises a main pixel region and a sub-pixel region, along a direction facing away from the substrate, the main pixel region comprises a first electrode, an organic light-emitting layer and a second electrode in turn, and the sub-pixel region comprises a third electrode and a fourth electrode in turn;
   wherein the first electrode is disposed in a same layer as the third electrode, the second electrode is disposed in a same layer as the fourth electrode, and the main pixel region is insulated from the sub-pixel region; and
   wherein the electrochromic layer is electrically connected to the second electrode and the fourth electrode separately;
   wherein the electrochromic layer comprises a plurality of electrochromic blocks disposed in one-to-one correspondence with the plurality of pixel units, a vertical projection of each of the plurality of electrochromic blocks onto the substrate covers the main pixel region of a respective one of the plurality of pixel units, and the each of the plurality of electrochromic blocks is electrically connected to the second electrode and the fourth electrode of a respective pixel unit; and
   wherein the display panel further comprises fifth electrodes, wherein the fifth electrodes are disposed on one surface of the electrochromic layer facing away from the substrate and each of the fifth electrodes is electrically connected to a respective one of a plurality of electrochromic blocks, and in a plane parallel to the substrate, each of a plurality of fifth electrodes covers the respective one of the plurality of electrochromic blocks, extends to the sub-pixel region and is electrically connected to the fourth electrode.

2. The display panel of claim 1, wherein the electrochromic layer has a first transmittance when the second electrode and the fourth electrode generate a first electric field and has a second transmittance when the second electrode and the fourth electrode generate a second electric field, wherein the first transmittance is greater than the second transmittance, the first transmittance is greater than or equal to 80%, and the second transmittance is less than or equal to 10%.

3. The display panel of claim 1, wherein the electrochromic layer is a monolithic structure, the plurality of pixel units are covered by a vertical projection of the electrochromic layer onto the substrate, and the electrochromic layer is electrically connected to the second electrode and the fourth electrode of the each of the plurality of pixel units.

4. The display panel of claim 1, wherein the electrochromic layer is made of at least one of tungsten trioxide, polythiophene and a derivative of the polythiophene, viologen, tetrathiafulvalene, or a metal phthalocyanine compound.

5. The display panel of claim 4, wherein the electrochromic layer is formed through at least one of an electroplating process, a chemical vapor deposition process, a physical vapor deposition process or an evaporation process.

6. The display panel of claim 1, further comprising:
   an encapsulation layer, which is disposed on one surface of the electrochromic layer facing away from the substrate, wherein the substrate is covered by a vertical projection of the encapsulation layer onto the substrate.

7. The display panel of claim 1, further comprising: a pixel defining layer, which is disposed on one surface of the pixel unit layer facing towards the substrate and is configured to insulate two adjacent pixel units of the plurality of pixel units from each other and insulate the main pixel region from the sub-pixel region in the each of the plurality of pixel units.

8. A display device, comprising a display panel, wherein the display panel comprises:
   a substrate, a pixel unit layer disposed on one surface of the substrate, and an electrochromic layer disposed on one surface of the pixel unit layer facing away from the substrate;
   wherein the pixel unit layer comprises a plurality of pixel units arranged in an array, wherein each of the plurality of pixel units comprises a main pixel region and a sub-pixel region, along a direction facing away from the substrate, the main pixel region comprises a first electrode, an organic light-emitting layer and a second electrode in turn, and the sub-pixel region comprises a third electrode and a fourth electrode in turn;
   wherein the first electrode is disposed in a same layer as the third electrode, the second electrode is disposed in a same layer as the fourth electrode, and the main pixel region is insulated from the sub-pixel region; and
   wherein the electrochromic layer is electrically connected to the second electrode and the fourth electrode separately;
   wherein the electrochromic layer comprises a plurality of electrochromic blocks disposed in one-to-one correspondence with the plurality of pixel units, a vertical projection of each of the plurality of electrochromic blocks onto the substrate covers the main pixel region of a respective one of the plurality of pixel units, and the each of the plurality of electrochromic blocks is electrically connected to the second electrode and the fourth electrode of a respective pixel unit; and
   wherein the display panel further comprises fifth electrodes, wherein the fifth electrodes are disposed on one surface of the electrochromic layer facing away from the substrate and each of the fifth electrodes is electrically connected to a respective one of a plurality of electrochromic blocks, and in a plane parallel to the substrate, each of a plurality of fifth electrodes covers the respective one of the plurality of electrochromic blocks, extends to the sub-pixel region and is electrically connected to the fourth electrode.

9. A driving method of a display panel, which is applied to the display panel, wherein the display panel comprises:
- a substrate, a pixel unit layer disposed on one surface of the substrate, and an electrochromic layer disposed on one surface of the pixel unit layer facing away from the substrate;
- wherein the pixel unit layer comprises a plurality of pixel units arranged in an array, wherein each of the plurality of pixel units comprises a main pixel region and a sub-pixel region, along a direction facing away from the substrate, the main pixel region comprises a first electrode, an organic light-emitting layer and a second electrode in turn, and the sub-pixel region comprises a third electrode and a fourth electrode in turn;
- wherein the first electrode is disposed in a same layer as the third electrode, the second electrode is disposed in a same layer as the fourth electrode, and the main pixel region is insulated from the sub-pixel region; and
- wherein the electrochromic layer is electrically connected to the second electrode and the fourth electrode separately;
- wherein the electrochromic layer comprises a plurality of electrochromic blocks disposed in one-to-one correspondence with the plurality of pixel units, a vertical projection of each of the plurality of electrochromic blocks onto the substrate covers the main pixel region of a respective one of the plurality of pixel units, and the each of the plurality of electrochromic blocks is electrically connected to the second electrode and the fourth electrode of a respective pixel unit; and
- wherein the display panel further comprises fifth electrodes, wherein the fifth electrodes are disposed on one surface of the electrochromic layer facing away from the substrate and each of the fifth electrodes is electrically connected to a respective one of a plurality of electrochromic blocks, and in a plane parallel to the substrate, each of a plurality of fifth electrodes covers the respective one of the plurality of electrochromic blocks, extends to the sub-pixel region and is electrically connected to the fourth electrode;
- wherein the method comprises:
- in condition that the main pixel region of the each of the plurality of pixel units is in a light-emitting state, controlling a first electric field generated between the second electrode and the fourth electrode of the each of the plurality of pixel units so that the electrochromic layer has a first transmittance; and
- in condition the main pixel region of the each of the plurality of pixel units is in a non-light-emitting state, controlling a second electric field generated between the second electrode and the fourth electrode of the each of the plurality of pixel units so that the electrochromic layer has a second transmittance, wherein the first transmittance is greater than the second transmittance.

10. The driving method of claim 9, further comprising:
- in condition that the main pixel region of the each of the plurality of pixel units is in the light-emitting state, inputting a first low level to the fourth electrode of the each of the plurality of pixel units and controlling the first electric field generated between the second electrode and the fourth electrode of the each of the plurality of pixel units so that an electrochromic block corresponding to the each of the plurality of pixel units has the first transmittance; and
- in condition that the main pixel region of the each of the plurality of pixel units is in the non-light-emitting state, inputting a first high level to the fourth electrode of the each of the plurality of pixel units and controlling the second electric field generated between the second electrode and the fourth electrode of the each of the plurality of pixel units so that the electrochromic block corresponding to the each of the plurality of pixel units has the second transmittance.

11. The driving method of claim 9, wherein the electrochromic layer is a monolithic structure, the plurality of pixel units are covered by a vertical projection of the electrochromic layer onto the substrate, and the electrochromic layer is electrically connected to the second electrode and the fourth electrode of the each of the plurality of pixel units; and
- wherein the driving method of the display panel comprises:
- in condition that an environment brightness of the display panel is lower than a first brightness threshold, controlling the first electric field generated between the second electrode and the fourth electrode of the each of the plurality of pixel units so that the electrochromic layer has the first transmittance; and
- in condition that the environment brightness of the display panel is higher than a second brightness threshold, controlling the second electric field generated between the second electrode and the fourth electrode of the each of the plurality of pixel units so that the electrochromic layer has the second transmittance, wherein the second brightness threshold is greater than the first brightness threshold.

12. The driving method of claim 9, further comprising:
- in condition that an environment brightness of the display panel is lower than a first brightness threshold, controlling the first electric field generated between the second electrode and the fourth electrode of the each of the plurality of pixel units so that the electrochromic layer has the first transmittance; and
- in condition that the environment brightness of the display panel is higher than a second brightness threshold, controlling the second electric field generated between the second electrode and the fourth electrode of the each of the plurality of pixel units so that the electrochromic layer has the second transmittance, wherein the second brightness threshold is greater than the first brightness threshold.

* * * * *